(12) United States Patent
Hirasawa

(10) Patent No.: US 7,759,848 B2
(45) Date of Patent: Jul. 20, 2010

(54) TUNING FORK TYPE PIEZOELECTRIC RESONATOR HAVING A NODE OF COMMON MODE VIBRATION IN CONSTRUCTED PART OF BASE

(75) Inventor: Kazuya Hirasawa, Kamiira-gun (JP)

(73) Assignee: Epson Toyocom Corporation, Tokyo (JP)

( * ) Notice: Subject to any disclaimer, the term of this patent is extended or adjusted under 35 U.S.C. 154(b) by 0 days.

(21) Appl. No.: 12/273,788

(22) Filed: Nov. 19, 2008

(65) Prior Publication Data

US 2009/0127983 A1    May 21, 2009

(30) Foreign Application Priority Data

Nov. 20, 2007    (JP) .............................. 2007-300823

(51) Int. Cl.
  *H01L 41/08*    (2006.01)
  *G01P 9/04*     (2006.01)
  *H03H 9/21*     (2006.01)
(52) U.S. Cl. ..................................................... 310/370
(58) Field of Classification Search ................. 310/370
   See application file for complete search history.

(56) References Cited

U.S. PATENT DOCUMENTS 3,697,789 A * 10/1972 Kato et al. ................. 310/344
4,191,906 A *  3/1980 Kogure ....................... 310/370
4,421,621 A * 12/1983 Fujii et al. ................ 204/192.12
4,628,734 A * 12/1986 Watson ...................... 73/504.16
5,386,726 A *  2/1995 Terajima .................... 73/504.16
6,065,339 A *  5/2000 Takeuchi et al. ........... 73/504.12
6,151,965 A * 11/2000 Watarai ..................... 73/504.16

FOREIGN PATENT DOCUMENTS

| JP | A-2001-165977 | 6/2001  |
| JP | A-2002-261575 | 9/2002  |
| JP | A-2006-352771 | 12/2006 |
| JP | A-2007-6091   | 1/2007  |
| JP | A-2007-81570  | 3/2007  |

* cited by examiner

*Primary Examiner*—J. SanMartin
(74) *Attorney, Agent, or Firm*—Oliff & Berridge, PLC

(57) ABSTRACT

A tuning fork type piezoelectric resonator element includes: a base including a pair of cuts provided opposite from each other and a constricted part located between the pair of cuts, a pair of resonator arms extending from the base, and an excitation electrode provided to each of the pair of resonator arms. When the pair of resonator arms vibrate at an inherent resonance frequency $f_{com}$ of a common mode at which the pair of resonator arms swing in a same direction, a node of the vibration of the common mode is located at the constricted part.

4 Claims, 9 Drawing Sheets

TUNING FORK TYPE PIEZOELECTRIC RESONATOR HAVING A NODE OF COMMON MODE VIBRATION IN CONSTRUCTED PART OF BASE

BACKGROUND

1. Technical Field

The present invention relates to a tuning fork type piezoelectric resonator element and a tuning fork type piezoelectric resonator.

2. Related Art

It is known that leak of vibration from resonator arms 902 is reduced if a base 904 having the resonator arms 902 extended therefrom is provided with cuts 906, with reference to FIG. 9 (see JP-A-2002-261575). However, the cuts 906 alone are not sufficient to stabilize the characteristics of a tuning fork type resonator element. For example, referring to FIG. 9, the vibration of the right and left resonator arms 902 may become irregular. In particular, if the tuning fork type piezoelectric resonator element is connected using a connecting member having an apparent elastic modulus, a dynamic storage elastic modulus, or a Young modulus during operation of 100 MPa or more, the frequency characteristics notably deteriorate and the resonator element does not stand practical use. The inventor of the invention analyzes that this is due to vibration of an X common mode. The X common mode vibration is, with reference to FIG. 10, vibration of the right and left resonator arms 902 in the same direction (in an X-axis direction when defining orientation of quartz crystal). Because a node of the X common mode vibration of the related-art tuning fork type resonator element is located around a section for connecting the resonator arms 902 to the base 904, the X common mode vibration has an inherent resonance frequency close to that of a required fundamental mode. As a result, the vibrations of the X common mode and the fundamental mode are combined, leading to deterioration of the characteristics. The inherent resonance frequency that generates vibration of the fundamental mode is higher than the inherent resonance frequency that generates vibration of the X common mode. If the two frequencies are close together, however, the inventors' analysis reveals that the X common mode vibration occurs even when excited in the fundamental mode. The fundamental mode herein indicates a mode of vibration at which the pair of resonator arms repeat approaching and separating to/from each other, and most tuning fork type piezoelectric resonators output inherent resonance frequencies of this fundamental mode.

SUMMARY

An advantage of the invention is to provide a tuning fork type piezoelectric resonator element and a tuning fork type piezoelectric resonator having stable characteristics.

According to an aspect of the invention, a tuning fork type piezoelectric resonator element includes: a base including a pair of cuts provided opposite from each other and a constricted part located between the pair of cuts, a pair of resonator arms extending from the base, and an excitation electrode provided to each of the pair of resonator arms, in that, when the pair of resonator arms vibrate at an inherent resonance frequency $f_{com}$ of a common mode at which the pair of resonator arms swing in a same direction, a node of the vibration of the common mode is located at the constricted part. According to this aspect of the invention, because the node of vibration in the common mode is located at the constricted part, the vibrating portion may become longer than the resonator arms. Therefore, the inherent resonance frequency of the common mode may decrease and separate from the inherent resonance frequency of the fundamental mode. As a result, the vibration of the common mode may not be readily generated when excited in the fundamental mode, and the characteristics may be stabilized.

It is preferable that, with the tuning fork type piezoelectric resonator element, the inherent resonance frequency $f_{com}$ of the common mode and an inherent resonance frequency $f_{fun}$ of a fundamental mode at which the pair of resonator arms approach and separate to/from each other be expressed in a formula: $f_{com}/f_{fun} < 0.95$.

According to another aspect of the invention, a tuning fork type piezoelectric resonator includes: the tuning fork type piezoelectric resonator element, a package housing the tuning fork type piezoelectric resonator element, and a connecting member connecting the tuning fork type piezoelectric resonator element to the package.

It is preferable that, with the tuning fork type piezoelectric resonator, a dynamic storage elastic modulus or a Young modulus of the connecting member be 100 MPa or more.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
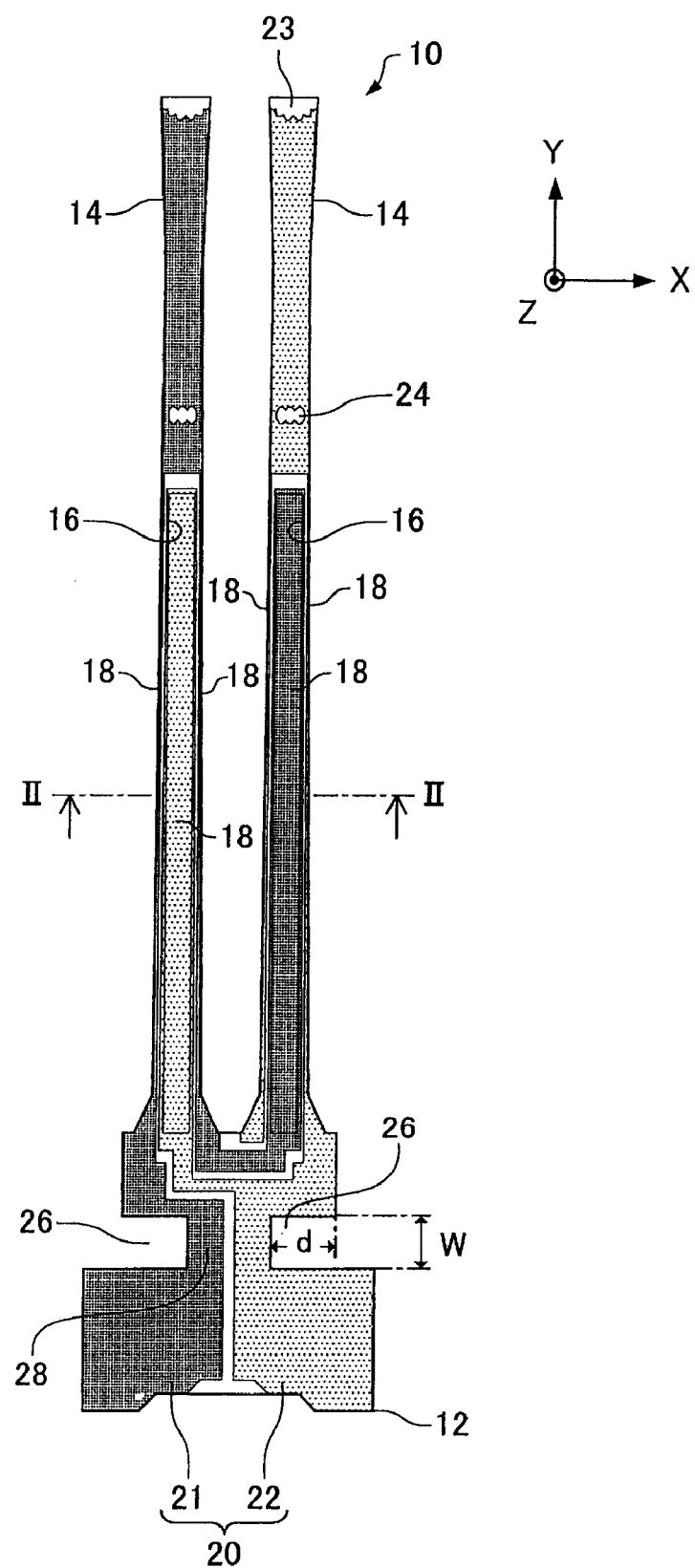
FIG. 1 is a plan diagram showing a tuning fork type piezoelectric resonator element according to an embodiment of the invention.
Figure 2:
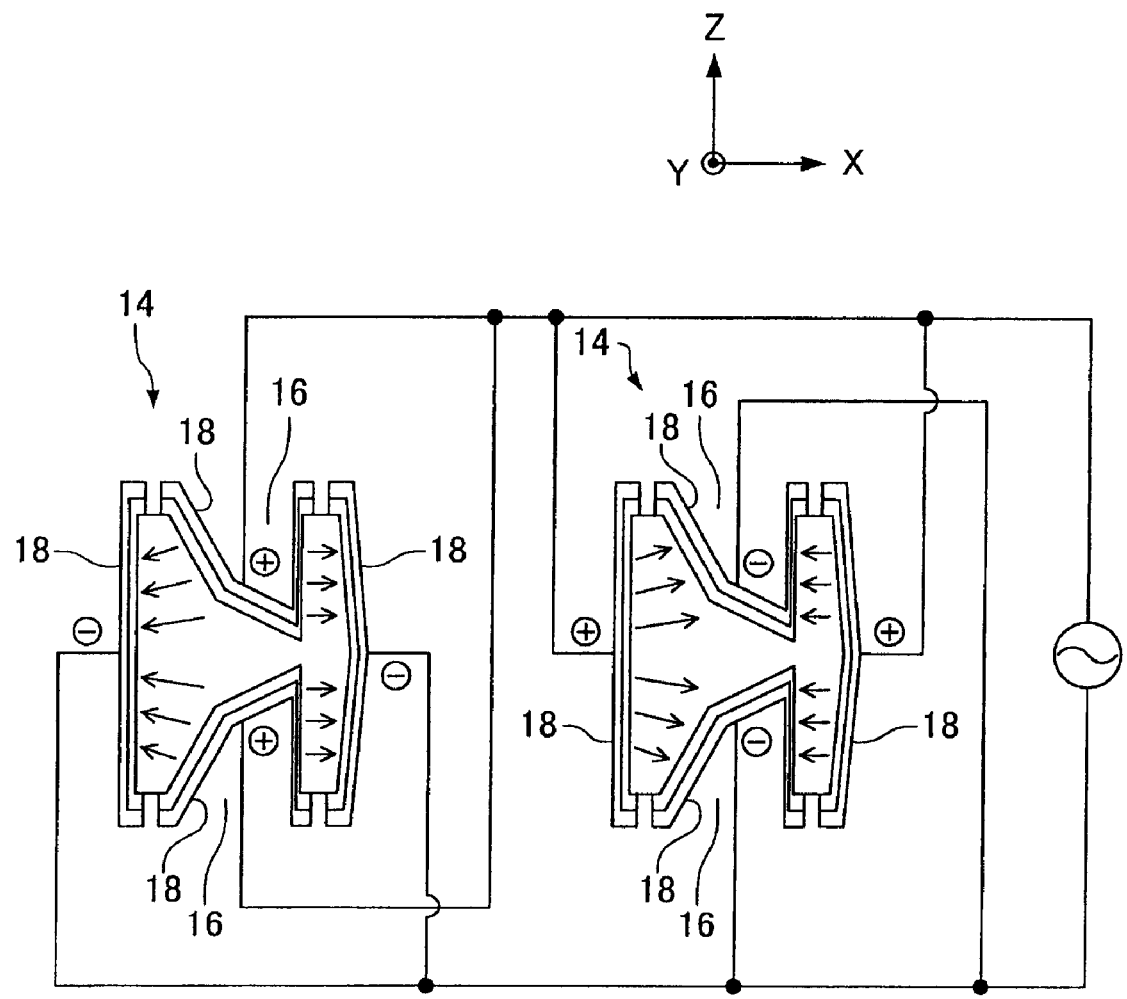
FIG. 2 is an enlarged sectional diagram of the tuning fork type piezoelectric resonator element of FIG. 1, taken on a line II-II.

FIG. 1 is a plan diagram showing a tuning fork type piezoelectric resonator element according to one embodiment of the invention. FIG. 2 is an enlarged sectional diagram of the tuning fork type piezoelectric resonator element of FIG. 1, taken on a line II-II. A bottom surface of the resonator element of FIG. 1 shows symmetry, as does the plan diagram. A tuning fork type piezoelectric resonator element 10, which is made of quartz crystal, has front and rear surfaces which face opposite from each other and define the thickness of the resonator arms. The tuning fork type piezoelectric resonator element 10 includes a base 12 and a pair of resonator arms 14 independently extending from the base 12. In addition to the resonator arms 14, the base 12 may also have support arms not shown in the drawings.

The resonator arms 14 includes: the front and rear surfaces facing opposite from each other and defining the thickness of the arms 14, and side surfaces connecting the front and rear surfaces on both sides. The pair of resonator arms 14 line in parallel with each other such that the side surfaces thereof face with each other. Referring to FIG. 2, one of the side surfaces (the surface facing a plus direction of an X axis) is shaped into a mound that is raised in a central direction of the thickness of the resonator arms 14, the thickness being defined by the distance between the front and rear surfaces. Provided on both front and rear surfaces of each resonator arm 14 are grooves 16 extending in a longitudinal direction. The grooves 16 allow movement and efficient vibration of the resonator arms 14, thereby decreasing the CI value.

Electrodes are provided to the pair of resonator arms 14 and the base 12. Excitation electrodes 18 are provided to the resonator arms 14. The excitation electrodes 18 are each separately provided to the side surfaces of the resonator arms 14 and inner surfaces of the grooves 16 (see FIG. 2). The excitation electrodes 18 provided to the opposing side surfaces of each resonator arm 14 are electrically coupled to each other on a tip part of the resonator arm 14. The excitation electrodes 18 provided to the inner surfaces of the grooves 16 are electrically coupled to each other on the side surfaces of the base 12. The excitation electrodes 18 on the side surfaces of one resonator arm 14 and the excitation electrodes 18 on the inner surfaces of the grooves 16 of the other resonator arm 14 are electrically coupled to each other on the base 12, thereby constituting a first pattern. The excitation electrodes 18 on the inner surfaces of the grooves 16 of one resonator arm 14 and the excitation electrodes 18 on the side surfaces of the other resonator arm 14 are electrically coupled to each other on the base 12, thereby constituting a second pattern.

The tuning fork type piezoelectric resonator element 10 includes coupling electrodes 20. The coupling electrodes 20 are provided to the base 12, to at least the front and rear surfaces of the base 12, and to the side surfaces of the base 12. The coupling electrodes 20 are electrically coupled to the excitation electrodes 18. Specifically, the coupling electrodes 20 provided to the base 12 include: a first coupling electrode 21 electrically coupled to the excitation electrodes 18 which constitute part of the mentioned first pattern, and a second coupling electrode 22 electrically coupled to the excitation electrodes 18 which constitute part of the mentioned second pattern.

An electrode film electrically couples these excitation electrodes 18, which are provided to the side surfaces of each resonator arm 14 closer to the tip part than to the grooves 16, and performs as a weight to each resonator arm 14. The weight of the weight can be adjusted by removing portions of this film. The heavier the tip part of the resonator arm 14 is, the lower the resonance frequency of the resonator arm 14 becomes, and the lighter the tip part is, the higher the resonance frequency of the resonator arm 14 becomes. This can be applied in adjustment of the frequencies. The electrode film thus includes a first electrode-film removing portion 23 and a second electrode-film removing portion 24. The surface of each resonator arm 14 is exposed from the first and second electrode-film removing portions 23 and 24.

Each coupling electrode 20 has a surface made at least of Au and may have a multilayer structure containing, for example, a Cr film as a base having a thickness between 100 Å or more and 1000 Å or less and an Au film having a thickness between 200 Å or more and 1000 Å or less. The Cr film is highly adhesive to quartz crystal, and the Au film has low electric resistance and is not readily oxidized. In substitution for the Cr film, an Ni film may be used.

In this embodiment, a voltage is applied between the excitation electrodes 18 provided to the inner surfaces of the grooves 16 and the excitation electrodes 18 provided to the side surfaces of the grooves 16. Application of voltage generates electric fields as shown by arrows in FIG. 2. The excitation electrodes 18 are coupled to an AC source by cross wiring and receive an alternating voltage as an excitation voltage. When excited at the inherent resonance frequency $f_{fun}$ of the fundamental mode, the resonator arms 14 perform opposite phase vibration (the tip parts of the resonator arms 14 approach and separate to/from each other) and thus perform flexural vibration.

The base 12 includes a pair of cuts 26 in opposite directions (in the directions of the pair of resonator arms 14 lined in parallel) so that a constricted configuration appears on a surface continuing from the front and rear surfaces of the resonator arms 14. The base 12 includes this constricted part 28 between the pair of cuts 26. The width of the constricted part 28 is a distance between the cuts 26 and is a distance in a direction parallel to the pair of resonator arms 14 lined in parallel. The width of the constricted part 28 may be 50% or less than the width of the base 12 and may be double, or less than double, the width of each resonator arm 14. Because the cuts 26 block transmission of vibration of the resonator arms 14, it is possible to suppress the transmission of vibration to outside (leak of vibration) through the base 12 and to prevent the CI value from rising.

Figure 3:
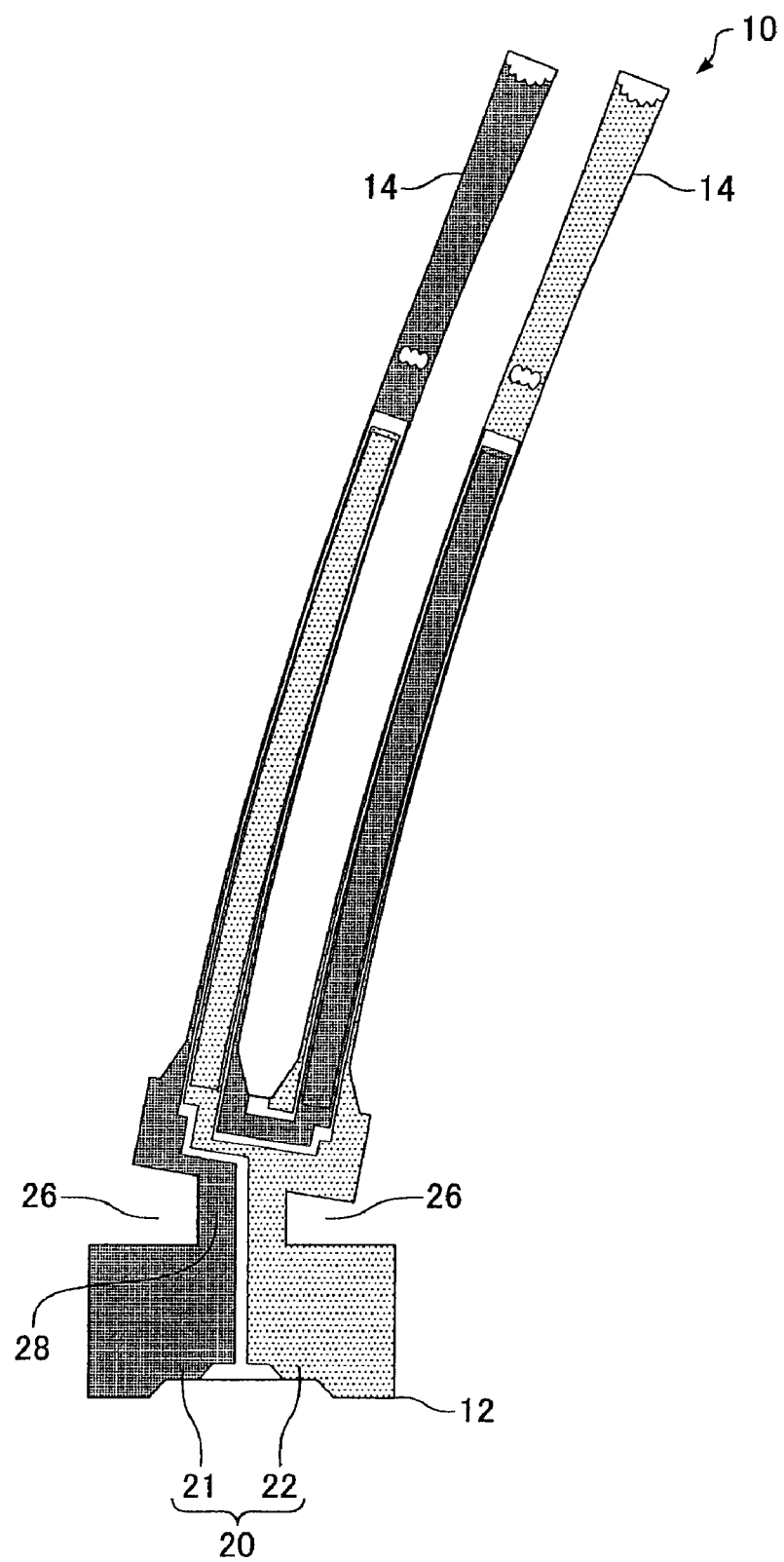
FIG. 3 is a diagram showing a pair of resonator arms vibrating at an inherent resonance frequency $f_{com}$ of a common mode.

FIG. 3 is a diagram showing the pair of resonator arms 14 vibrating at an inherent resonance frequency $f_{com}$ of a common mode. In this embodiment, the rigidity (or flexibility) of the constricted part 28 is established such that a node of vibration of the common mode is located at the constricted part 28 of the pair of resonator arms 14 when the arms 14 vibrate at the inherent resonance frequency $f_{com}$ of the common mode at which the pair of arms 14 swing in the same direction (e.g., in the plus direction of the X axis). In other words, a depth d and a width w of the cuts 26 are established in order that the constricted part 28 has such rigidity (or flexibility). The depth d and the width w of the cuts 26 depend on the thicknesses of the resonator arms 14 and the base 12, the length of the resonator arms, and the width and length of the base 12.

The inherent resonance frequency $f_{com}$ of the common mode may defined as below. The wiring of the electrodes on the base 12 is changed so that the excitation electrodes 18 provided to the inner surfaces of the grooves 16 of the pair of resonator arms 14 (referred to as "groove electrodes" in this paragraph) are coupled to each other, and that the excitation electrodes 18 provided to the side surfaces of the pair of resonator arms 14 (referred to as "side surface electrodes" in this paragraph) are coupled to each other. Then, the groove electrodes and the side surface electrodes are coupled to the AC source, and the resonator arms 14 are vibrated in the common mode. The frequency that allows efficient vibration of the arms 14 is then defined as the inherent resonance frequency $f_{com}$.

Figure 8:
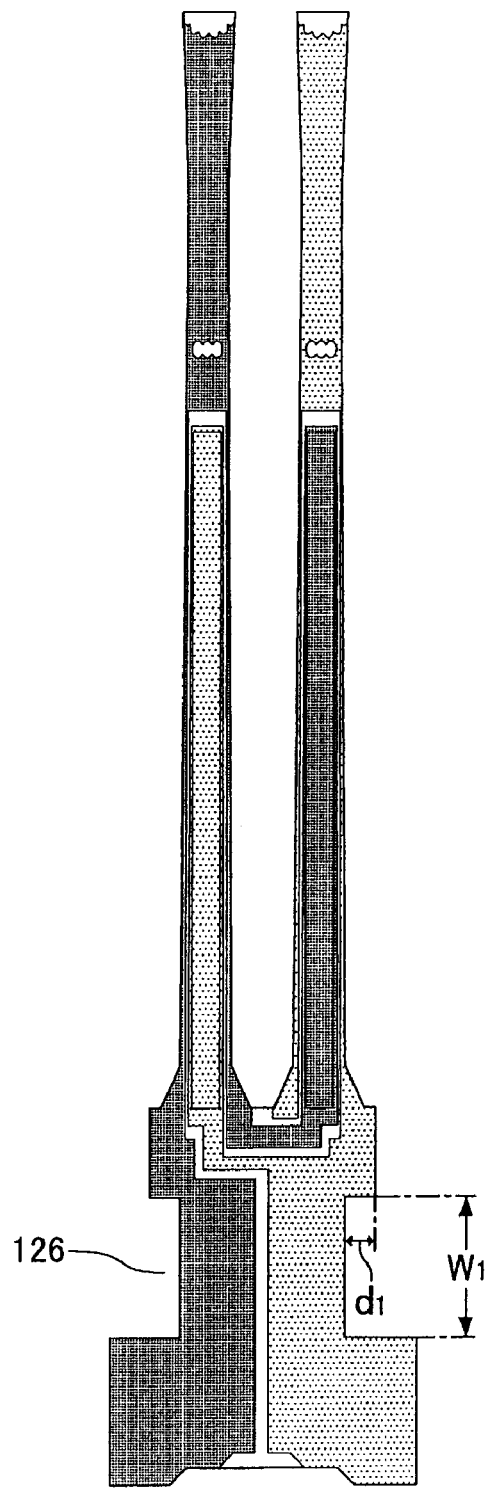
FIG. 8 is a plan diagram showing the tuning fork type piezoelectric resonator element according to a modification of the embodiment of the invention.

FIG. 8 is a plan diagram showing the tuning fork type piezoelectric resonator element according to a modification of the embodiment of the invention. Cuts 126 shown in FIG.

8 have a depth $d_1$ deeper than the depth d of the cuts 26 shown in FIG. 1 and a width $w_1$ wider than the width w of the cuts 26. Thus, because the depth and width of the cuts 26 and 126 are determined in a relative manner, it is possible to decrease the depth by increasing the width and vise versa.

Figure 10:
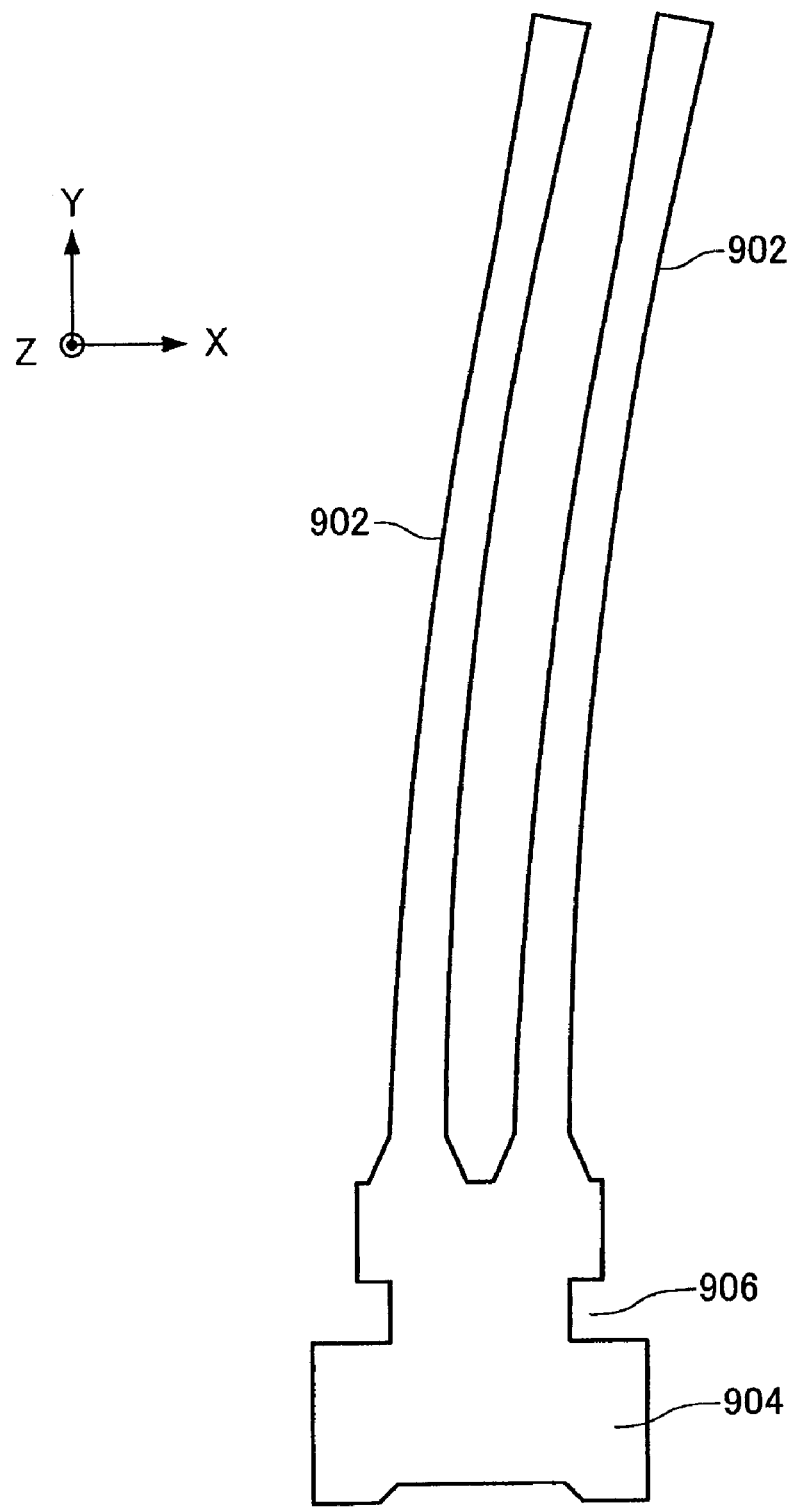
FIG. 10 is a diagram showing the pair of resonator arms of the tuning fork type piezoelectric resonator element of the related art, the arms vibrating at an inherent resonance frequency $f_{com}$ of a common mode.

In this embodiment, the vibration node is located at the constricted part 28 of the base 12 when the pair of resonator arms 14 are vibrated at the inherent resonance frequency $f_{com}$ of the common mode, unlike the related art of FIG. 10. Therefore, the vibrating portion becomes longer, and the inherent resonance frequency $f_{com}$ of the common mode is decreased, leading to a greater difference from the inherent resonance frequency $f_{fun}$ of the fundamental mode. The inherent resonance frequency $f_{com}$ of the common mode and the inherent resonance frequency $f_{fun}$ of the fundamental mode are expressed in a formula: $f_{com}/f_{fun} < 0.95$.

Figure 4:
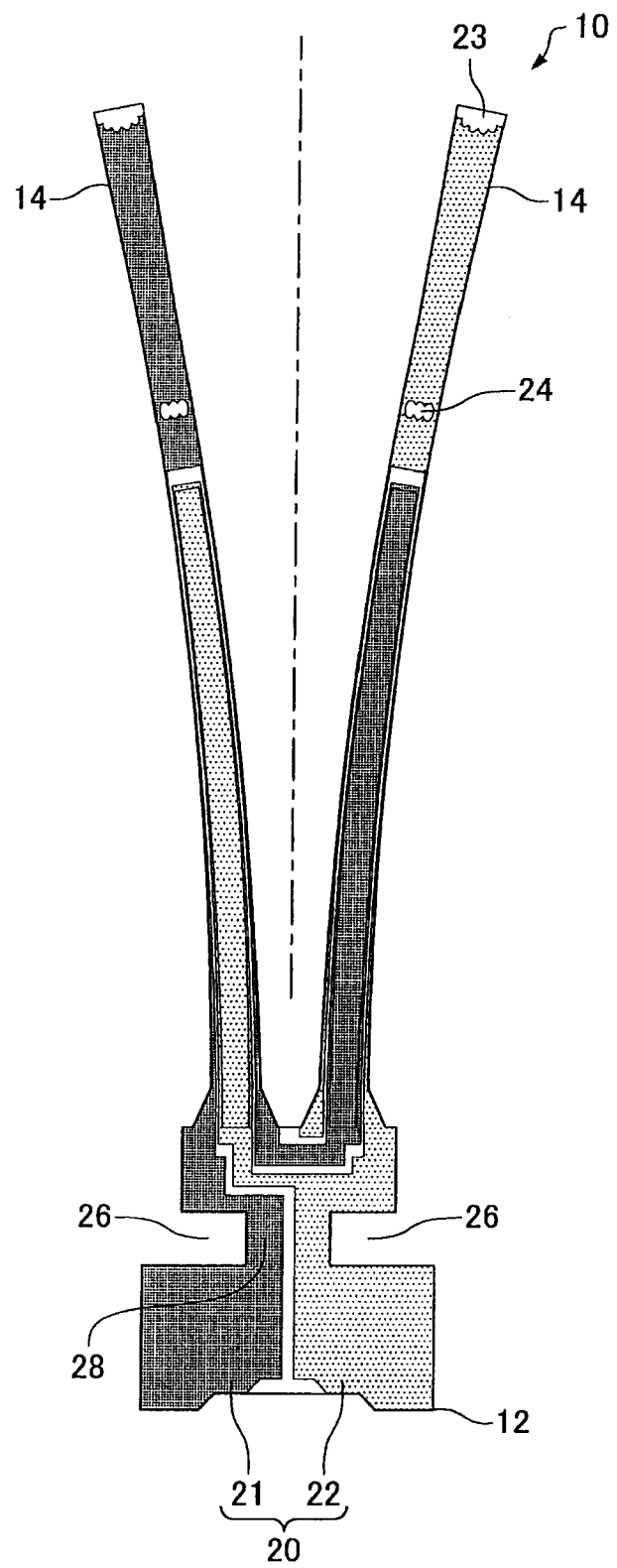
FIG. 4 is a diagram showing the pair of resonator arms vibrating at an inherent resonance frequency $f_{fun}$ of a fundamental mode.
Figure 9:
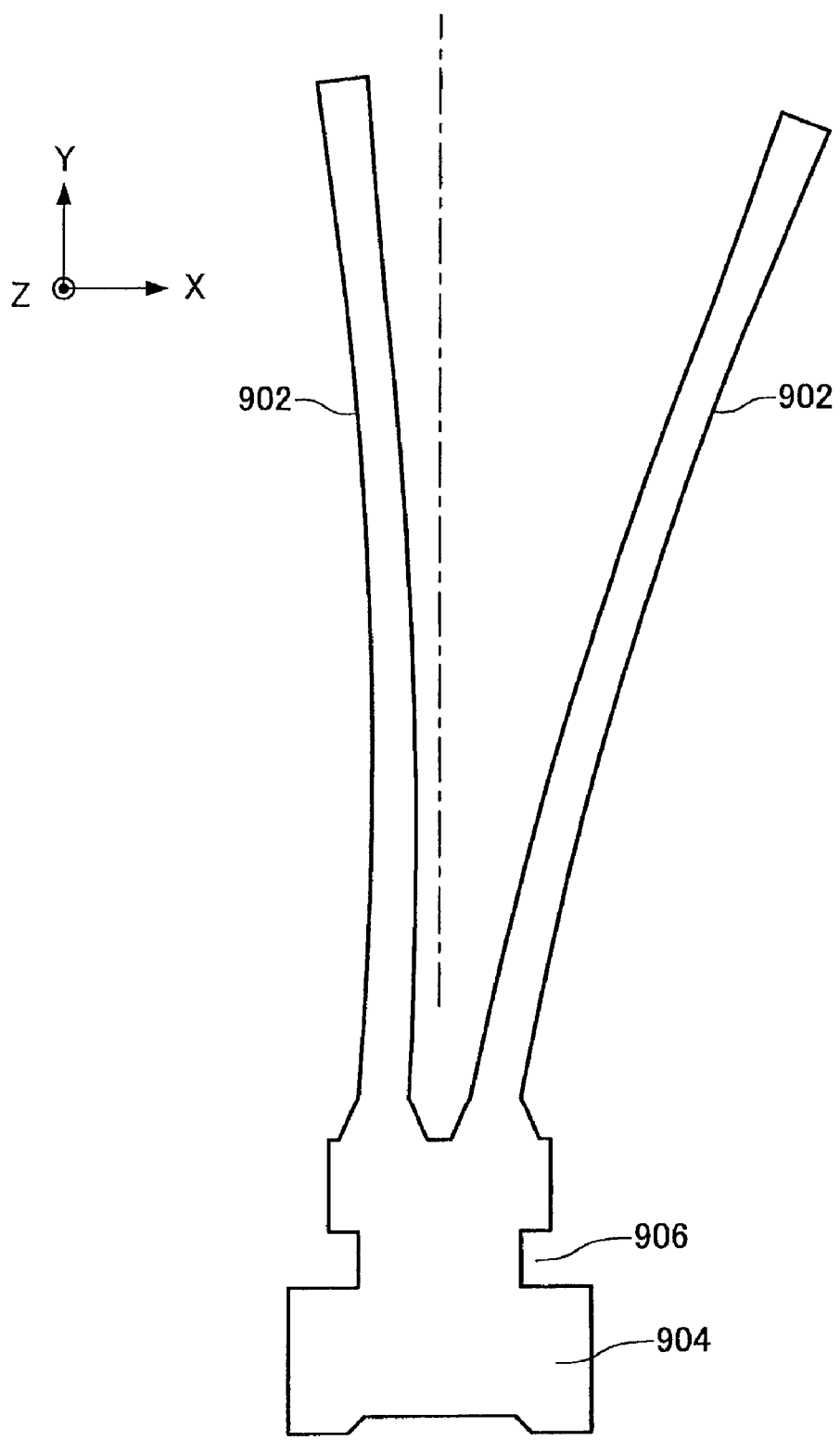
FIG. 9 is a diagram showing a pair of resonator arms of a tuning fork type piezoelectric resonator element of a related art, the arms vibrating at an inherent resonance frequency $f_{fun}$ of a fundamental mode.

FIG. 4 is a diagram showing the pair of resonator arms vibrating at the inherent resonance frequency $f_{fun}$ of the fundamental mode. In this embodiment, unlike the related art with reference to FIG. 9, the inherent resonance frequency $f_{com}$ of the common mode differs greatly from the inherent resonance frequency $f_{fun}$ of the fundamental mode. Thus, because vibration of the common mode does not readily occur when excited in the fundamental mode, the characteristics can be stabilized.

Figure 5:
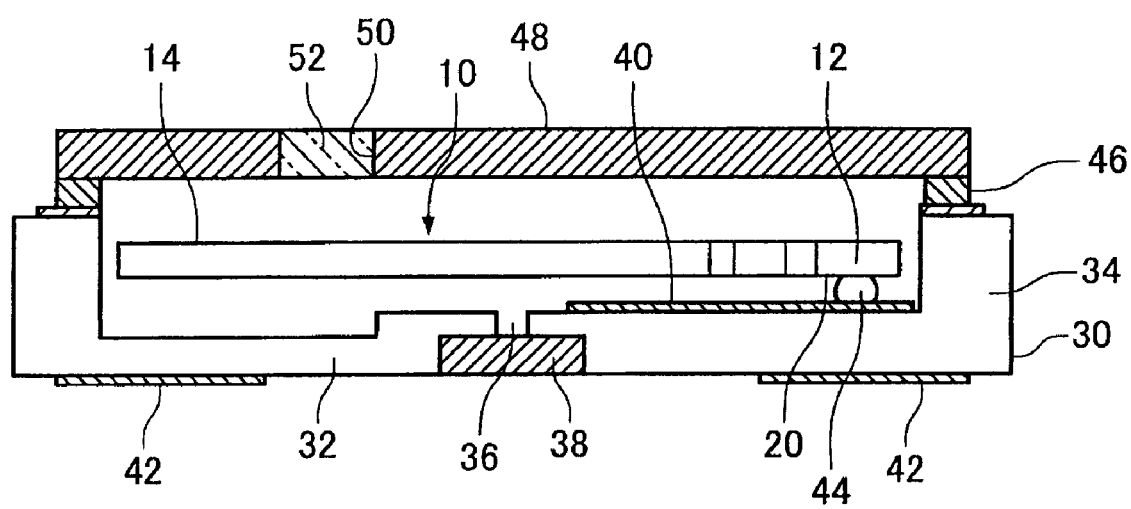
FIG. 5 is a sectional diagram of the tuning fork type piezoelectric resonator according to another embodiment of the invention.
Figure 6:
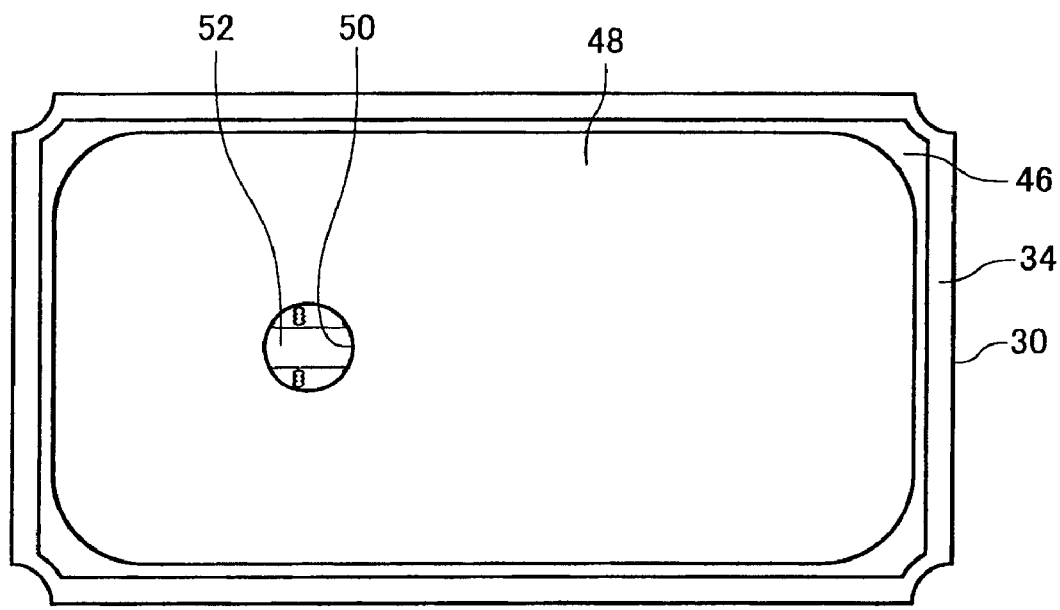
FIG. 6 is plan diagram of the tuning fork type piezoelectric resonator shown in FIG. 5.
Figure 7:
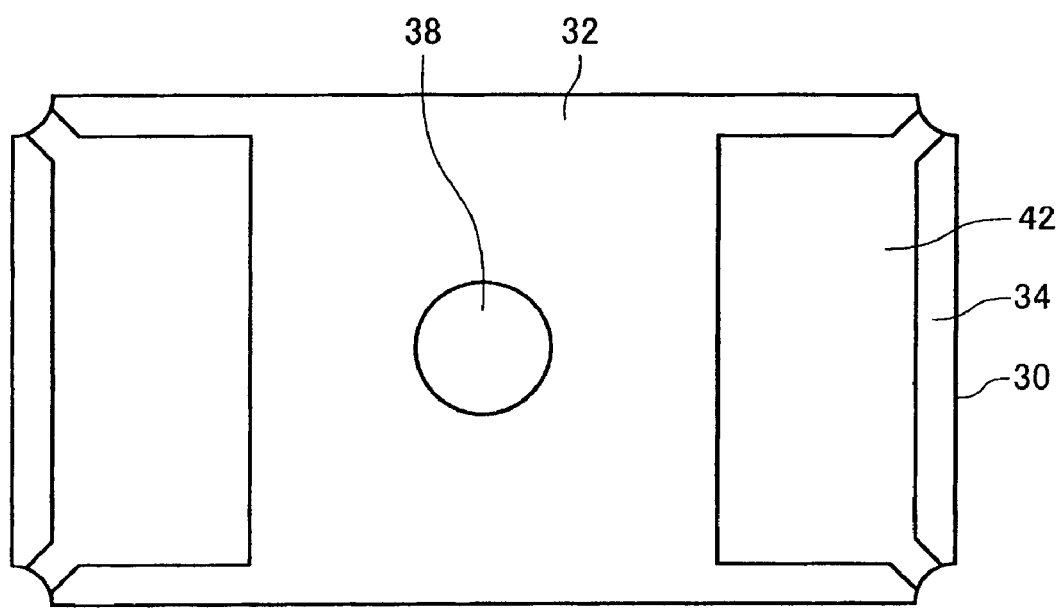
FIG. 7 is a diagram of the bottom surface of the tuning fork type piezoelectric resonator shown in FIG. 5.

FIG. 5 is a sectional diagram of the tuning fork type piezoelectric resonator according to the embodiment of the invention. FIG. 6 is plan diagram of the tuning fork type piezoelectric resonator shown in FIG. 5. FIG. 7 is a diagram of a bottom surface of the tuning fork type piezoelectric resonator shown in FIG. 5.

The tuning fork type piezoelectric resonator includes a package 30 housing the tuning fork type piezoelectric resonator element 10. The package 30 has a bottom 32 to which the tuning fork type piezoelectric resonator element 10 is fixed and a frame wall 34 surrounding the bottom 32. An air hole 36 used for evacuation is provided to the bottom 32 and is sealed with a seal 38 made of a brazing material (e.g., AuGe).

A fixed electrode 40 is provided to the inner surface of the package 30 (of the bottom 32). The fixed electrode 40 has a surface made of Au. External terminals 42 are provided to the outer surface of the package 30 (of the bottom 32). The fixed electrode 40 and the external terminals 42 are electrically coupled by wiring (not shown). The external terminals 42 are mounted on a wiring pattern (not shown) of a circuit substrate using e.g. solder.

The tuning fork type piezoelectric resonator element 10 is fixed to the package 30 (to the bottom 32). The resonator element 10 is fixed in a manner that the resonator arm 14 extends from the base 12 to the frame wall 34. The base 12 is fixed to the bottom 32, and the resonator arm 14 is situated afloat from the package 30. The bottom 32 has a lowered region that faces the tip part of the resonator arm 14, so that the resonator arm 14 does not readily come into contact with the bottom 32 when bent.

The package 30 and the resonator element 10 are fixed using a connecting member 44. The connecting member 44 may be a metallic material such as a conductive resin material or solder. The metallic material is desirable since it does not emit gas when heated. The connecting member 44 may have a dynamic storage elastic modulus or a Young modulus of 100 MPa or more. The connecting member 44 connects the base 12 to the package 30 while holding the resonator arm 14 afloat from the package 30. The connecting member 44 electrically and mechanically connects the coupling electrode 20 to the fixed electrode 40. In the embodiment, the connecting member 44 only connects the coupling electrode 20 to the fixed electrode 40 and does not connect the material (quartz crystal) of the resonator element 10 to the material (ceramic) of the package 30. However, these materials may be connected. Additionally, as a modified example, if the tuning fork type piezoelectric resonator element has support arms having the coupling electrodes, and the support arms are fixed to the package, the electric coupling may be conducted using the support arms.

The whole package 30 may be made of metal. However, if the package 30 is mainly made of nonmetal such as ceramic, an upper end surface of the frame wall 34 is matalized. An Mo (or W) film, an Ni film, and an Au film are stacked in this order on the nonmetal portion of the frame wall 34, and the upper end surface is made of Au. The upper end surface is configured so as to surround an upper part of the bottom 32. A ring 46 is fixed to the upper end surface, interposing therebetween a layer of a brazing material made of an alloy containing e.g. Ag. The ring 46 overlaps with the upper end surface, seamlessly surrounding the upper part of the bottom 32. The ring 46 is for seam welding and includes a layer made of e.g. kovar. A lid 48 is fixed to the ring 46.

The lid 48 overlaps with the package 30, to which the resonator element 10 is fixed, and seals an aperture of the package. The lid 48 has a through hole 50 penetrating the front and rear surfaces of the lid 48. The through hole 50 has a configuration of a circular aperture. The lid 48 contains a light-transmitting member 52 made of a material such as glass or resin. The light-transmitting member 52 adheres to the inner surface of the through hole 50.

The tuning fork type piezoelectric resonator as described may constitute an oscillator or a sensor. If an oscillator is constituted using an oscillation circuit containing the tuning fork type piezoelectric resonator, AC signals with high frequency accuracy can be obtained. Also, a sensor having the resonator is a sensor for detecting the physical quantities, utilizing fluctuation of the frequency of the resonator element 10 that occurs in accordance with physical quantities. Examples of the sensor are a sensor for detecting e.g. a stress generated by temperature and acceleration and a sensor for detecting a Coriolis force generated by angular velocity.

Fabrication of the tuning fork type piezoelectric resonator according to the embodiment of the invention will now be described. The fabrication of the resonator includes fabrication of the resonator element 10. In making the resonator element 10 out of quartz crystal, a quartz crystal wafer to be used is a crystal Z-plate which is cut out in a clockwise rotation within the range of 0 to 5 degrees around a Z-axis of an orthogonal coordinate system containing X, Y, and Z axes and which is obtained by cutting and polishing into a predetermined thickness. While joined together, a plurality of resonator elements 10 are cut out from one crystal wafer and eventually diced into individual resonator elements 10. Provided to each resonator element 10 are the electrode film that includes the excitation electrodes 18 and the coupling electrodes 20.

A process of providing the first electrode-film removing portion 23 through removal of portions of the electrode film is conducted prior to the process of fixing the resonator element 10 to the package 30. Specifically, the first electrode-film removing portion 23 is formed before integrating the resonator element 10 into the resonator (either before or after dicing the plurality of joined resonator elements 10, which was cut out from the crystal wafer, into individual resonator elements 10), so as to conduct frequency adjustments. The removal of portions of the electrode film is done with laser beams. The first electrode-film removing portion 23, which is closer to the tip of each resonating arm 14 than the second electrode-film removing portion 24 is, has a large effect of making the resonator arm 14 to vibrate more readily (of raising the frequency). The frequency adjustment process through formation of the first electrode-film removing portion 23 aims to roughly adjust the frequencies and, thus, can be called a course adjustment. Because the frequency adjustment is conducted before attaching the resonator element 10 to the package 30, it is possible to reduce the amount of film to be removed when forming the second electrode-film removing portion 24, which will be described hereafter.

The fabrication of the tuning fork type piezoelectric resonator includes preparation of the package 30. The ring 46 is fixed in advance to the frame wall 34 of the package 30 with the brazing material. Then, the resonator element 10 is fixed to the bottom 32. For this fixation, the connecting member 44 is used. Other details correspond to any relevant descriptions of the composition of the tuning fork type piezoelectric resonator described above.

The fabrication of the tuning fork type piezoelectric resonator includes: arranging the lid 48 such that the lower surface of the light-transmitting member 52 faces the electrode film, and connecting the frame wall 34 to the lid 48. The connection is conducted by seam welding. The aperture of the package 30 is sealed with the lid 48. Because the lid 48 is connected by seam connection, the heating involves local heating and not overall heating. Therefore, a small amount of the electrode film to be removed is sufficient when forming the second electrode-film removing portion 24 for the frequency adjustment because distortion of the resonator element 10 caused by heat is small. Also, a little gas is emitted. In order to suppress the distortion of the light-transmitting member 52 during seam connection, the light-transmitting member 52 is disposed away from an area at which the seam connection is conducted.

After sealing the aperture of the package 30 with the lid 48, the inside of the package sealed with the lid 48 is evacuated, and the air hole 36 is sealed with the brazing material.

The fabrication of the tuning fork type piezoelectric resonator further includes a process of providing the second electrode-film removing portion 24. The process is performed after sealing the aperture of the package 30 with the lid 48 (or even after the evacuation process, for example). The process is conducted by irradiating the electrode film with laser beams through the light-transmitting member 52. Because the second electrode-film removing portion 24 is located farther from the tip of each resonating arm 14 than the first electrode-film removing portion 23 is, the effect of making the resonator arm 14 to vibrate readily (the effect of raising the frequency) is small. However, to the contrary, it can be said that this enables fine adjustments.

The fabrication of the tuning fork type piezoelectric resonator according to the embodiment of the invention includes the described processes and further includes fabrication processes that are apparent from the composition of the tuning fork type piezoelectric resonator as described hereinbefore.

The invention is not limited to the described embodiments but allows various modifications. For example, the invention includes compositions (e.g., compositions involving the same functions, methods, and results, or compositions having the same objectives and effects) that are substantially the same as those described in the embodiments. Also, the invention includes compositions in which non-essential elements of the structures described in the embodiments are substituted for other elements. Moreover, the invention includes compositions with which the same operational effects can be produced and the same objectives can be achieved as those with the compositions described in the embodiments. Furthermore, the invention includes compositions by known techniques in addition to the compositions as described in the embodiments.

The entire disclosure of Japanese Patent Application No. 2007-300823, filed Nov. 20, 2007 is expressly incorporated by reference herein.

What is claimed is:

1. A tuning fork type piezoelectric resonator element, comprising:
   a base, the base including:
   a pair of cuts provided opposite from each other; and
   a constricted part located between the pair of cuts;
   a pair of resonator arms extending from the base; and
   an excitation electrode provided to each of the pair of resonator arms, wherein,
   the resonator arms are configured to have an inherent resonance frequency $f_{com}$ of a common mode at which the pair of resonator arms swing in a same direction when vibrated at the inherent resonance frequency $f_{com}$, and the constricted part being configured so that a node of the vibration of the common mode is located at the constricted part.

2. The tuning fork type piezoelectric resonator element according to claim 1, wherein
   the resonator element is configured to have an inherent resonance frequency $f_{fun}$ of a fundamental mode at which the pair of resonator arms swing in opposing directions when vibrated at the inherent resonance frequency $f_{fun}$, the constricted part being configured so that the inherent resonance frequency $f_{com}$ of the common mode and the inherent resonance frequency $f_{fun}$ of the fundamental mode satisfy the relationship $f_{com}/f_{fun}<0.95$.

3. A tuning fork type piezoelectric resonator, comprising:
   the tuning fork type piezoelectric resonator element according to claim 1;
   a package housing the tuning fork type piezoelectric resonator element; and
   a connecting member connecting the tuning fork type piezoelectric resonator element to the package.

4. The tuning fork type piezoelectric resonator according to claim 3, wherein
   a dynamic storage elastic modulus or a Young modulus of the connecting member is 100 MPa or more.

* * * * *

UNITED STATES PATENT AND TRADEMARK OFFICE
CERTIFICATE OF CORRECTION

| | |
|---|---|
| PATENT NO. | : 7,759,848 B2 |
| APPLICATION NO. | : 12/273788 |
| DATED | : July 20, 2010 |
| INVENTOR(S) | : Kazuya Hirasawa |

It is certified that error appears in the above-identified patent and that said Letters Patent is hereby corrected as shown below:

On the Title Page and Col. 1 lines 1-4

Please amend the title as follows:

Item (54), please change "TUNING FORK TYPE PIEZOELECTRIC RESONATOR HAVING A NODE OF COMMON MODE VIBRATION IN CONSTRUCTED PART OF BASE"

to

-- TUNING FORK TYPE PIEZOELECTRIC RESONATOR HAVING A NODE OF COMMON MODE VIBRATION IN CONSTRICTED PART OF BASE --.

Signed and Sealed this
First Day of November, 2011

David J. Kappos
*Director of the United States Patent and Trademark Office*